US012222448B1

(12) United States Patent
Bhardwaj et al.

(10) Patent No.: US 12,222,448 B1
(45) Date of Patent: Feb. 11, 2025

(54) LIDAR SENSOR SYSTEM INCLUDING INTEGRATED MODULATOR

(71) Applicant: Aurora Operations, Inc., Pittsburgh, PA (US)

(72) Inventors: Ashish Bhardwaj, Fremont, CA (US); Sen Lin, Mountain View, CA (US); Dong Liu, San Jose, CA (US); Xue Liu, San Jose, CA (US); Andrew Steil Michaels, Los Altos, CA (US)

(73) Assignee: AURORA OPERATIONS, INC., Pittsburgh, PA (US)

( * ) Notice: Subject to any disclaimer, the term of this patent is extended or adjusted under 35 U.S.C. 154(b) by 0 days.

(21) Appl. No.: 18/516,671

(22) Filed: Nov. 21, 2023

(51) Int. Cl.
*G01S 7/481* (2006.01)
*G01S 17/931* (2020.01)
*H01L 31/0352* (2006.01)

(52) U.S. Cl.
CPC .......... *G01S 7/4816* (2013.01); *G01S 17/931* (2020.01); *H01L 31/035236* (2013.01)

(58) Field of Classification Search
None
See application file for complete search history.

(56) References Cited

U.S. PATENT DOCUMENTS 6,719,884 B2 * 4/2004 Marsh .................... B82Y 20/00 427/596
10,948,600 B1 * 3/2021 Barber ................... G05D 1/228
2017/0084775 A1 * 3/2017 Li ..................... B01L 3/502707
2019/0088691 A1 * 3/2019 Nobusa ................. H01L 31/107
2020/0058822 A1 * 2/2020 Yeh ................... H01L 31/03044
2020/0150240 A1 * 5/2020 Huwer .................. G01S 7/4865
2021/0201126 A1 * 7/2021 Meng ........................ G02F 3/00
2023/0101241 A1 * 3/2023 Chen ...................... H01L 33/36 257/79

OTHER PUBLICATIONS

Monolithic multi-color, multi-quantum well semiconductor LED (Year: 2017).*
Monolithically integrated semiconductor amplifier and modulator (Year: 2005).*

* cited by examiner

*Primary Examiner* — Luke D Ratcliffe
*Assistant Examiner* — Jempson Noel
(74) *Attorney, Agent, or Firm* — Dority & Manning, P.A.

(57) ABSTRACT

A light detection and ranging (LIDAR) sensor system for a vehicle can include: a light source configured to output a beam; a photonics integrated circuit (PIC) including a semiconductor die, the semiconductor die including a substrate having two or more semiconductor stacks respectively associated with two or more semiconductor devices formed on the substrate, the two or more semiconductor devices respectively configured to receive the beam from the light source and modify one or more features of the beam; a transmitter configured to receive the beam from the semiconductor die; and one or more optics configured to receive the beam from the transmitter and emit the beam towards an object.

15 Claims, 7 Drawing Sheets

500
510
534
530
532
3rd GROWTH
520
522
2nd GROWTH
1st GROWTH
508
507
506
t
505
504
502

LIDAR SENSOR SYSTEM INCLUDING INTEGRATED MODULATOR

BACKGROUND

Light Detection and Ranging (LIDAR) systems use lasers to create three-dimensional representations of surrounding environments. A LIDAR system includes at least one emitter paired with a receiver to form a channel, though an array of channels may be used to expand the field of view of the LIDAR system. During operation, each channel emits a laser beam into the environment. The laser beam reflects off of an object within the surrounding environment, and the reflected laser beam is detected by the receiver. A single channel provides a single point of ranging information. Collectively, channels are combined to create a point cloud that corresponds to a three-dimensional representation of the surrounding environment.

SUMMARY

Aspects and advantages of implementations of the present disclosure will be set forth in part in the following description, or may be learned from the description, or may be learned through practice of the implementations.

Example aspects of the present disclosure are directed to LIDAR systems. As further described herein, the LIDAR systems can be used by various devices and platforms (e.g., robotic platforms, etc.) to improve the ability of the devices and platforms to perceive their environment and perform functions in response thereto (e.g., autonomously navigating through the environment).

The technology of the present disclosure is directed to an integrated and co-packaged assemblies of silicon photonics dies with group III-V semiconductor dies to improve performance of LIDAR systems. In particular, a group III-V semiconductor die can include one or more semiconductor devices, such as modulators, preamplifiers, and/or amplifiers respectively associated with a channel on the semiconductor die. The group III-V die can be coupled to a photonics die that feeds a light beam to the channels of the group III-V die.

One example implementation of this technology is a photonic integrated circuit having a group III-V die coupled to a silicon photonics die. The silicon photonics die includes a light source (e.g., a seed laser) that directs a beam to a modulator. The modulator is configured to modulate the beam to produce a modulated beam. The modulator can be configured to modulate phase and/or frequency of the light source such that the modulated beam can include a phase-modulated beam and/or a frequency-modulated beam. The modulated beam is provided to an amplifier formed of one or more channels of the group III-V die. The amplifier is configured to amplify the beam to produce an amplified beam. The amplified beam is provided to a transceiver chip configured to emit the amplified beam at a target and receive a reflected beam from the target. A LIDAR system can determine a distance to the target and/or velocity of the target based on the reflected beam.

Another example implementation of this technology is a photonic integrated circuit having a semiconductor die (e.g., a group III-V semiconductor die) coupled to a silicon photonics die. The silicon photonics die includes a light source (e.g., a seed laser) that feeds a beam to a modulator formed as a channel of the semiconductor die. The modulator is configured to modulate the beam to produce a modulated beam which is then fed to an amplifier formed of one or more channels of the same semiconductor die. The amplifier can amplify the modulated beam to produce an amplified beam, which can then be provided to a transceiver chip configured to emit the amplified beam at an object and receive a reflected beam from the object. A LIDAR system can determine a distance to the object and/or velocity of the object based on the reflected beam.

Furthermore, in another example implementation, the semiconductor die includes both a preamplifier stage and an amplifier stage respectively formed of one or more channels on the same semiconductor die. The preamplifier stage can produce a preamplified beam that is amplified compared to the modulated beam, but is not yet amplified to an intensity for LIDAR applications. The amplifier stage can amplify the preamplified beam to an intensity for LIDAR applications to produce the amplified beam that is provided to the transceiver chip. Although the preamplifier stage and the amplifier stage can operate independently, they can be formed on the same group III-V die.

In some implementations, the one or more channels formed in the semiconductor die can be arranged in different directions. For example, one or more channels formed in the semiconductor die can be configured to direct light in a first direction, while one or more other channels formed in the semiconductor die can be configured to direct light in a second direction that is substantially parallel to but opposite the first direction. For example, one or more channels associated with a first semiconductor device (e.g., a preamplifier) can be configured to direct light in the first direction, while one or more channels associated with a second semiconductor device (e.g., a modulator and/or amplifier) can be configured to direct light in the second direction.

In keeping with such implementations, the semiconductor die can be characterized by a particular facet (e.g., a first facet, such as the facet that is coupled to the at least one photonics die). An input of at least a first channel of the one or more channels of the semiconductor die and an output of at least a second channel of the one or more channels of the semiconductor die are positioned on the particular facet of the semiconductor die. The semiconductor die can be further characterized by another particular facet (e.g., a second facet opposite the first facet, such as the facet that is coupled to a transceiver die/chip). Similar to the first facet, an input of at least a third channel of the one or more channels of the semiconductor die and an output of at least a fourth channel of the one or more channels of the semiconductor die are positioned on the second facet of the semiconductor die.

The semiconductor devices of the group III-V die can be formed by parallel regrowth, where multiple different semiconductor devices can be separately grown and cointegrated on the same die without requiring the devices to be joined by a butt joint. In particular, the devices can be grown on the same substrate by first growing a regrowth on multiple semiconductor stacks and etching away the portion of the regrowth on the semiconductor stack(s) not associated with the device for which the layer is grown. New layers for the other semiconductor device(s) are then grown in the previously etched regions. As a result, a substrate is formed having multiple independently-acting semiconductor devices formed on a single substrate, without requiring those devices to be joined by a butt joint. By eliminating the butt joint, the devices can avoid optical loss and manufacturing inefficiencies associated with the butt joint, thereby improving the quality of the LIDAR systems utilizing the semiconductor devices.

A LIDAR system according to the present disclosure can provide numerous technical effects and benefits. For instance, the LIDAR systems according to the present disclosure can include multiple types of semiconductor devices (e.g., modulators, amplifier, etc.) on a common substrate. Additionally, the semiconductor devices can be interfaced without requiring a butt joint or other combinative manufacturing. In this manner, the devices can have reduced manufacturing costs, increased manufacturing efficiency, and/or improved performance compared to some existing LIDAR systems.

Furthermore, in some cases, it can be beneficial to use group III-V semiconductor devices to generate light as other semiconductors (e.g., silicon) may be unable to or may provide reduced performance at generating light. Example aspects of the present disclosure provide a highly efficient architecture for providing high power light signals in an integrated chip that can easily be incorporated into a larger system (e.g., a LIDAR system).

For example, in an aspect, the present disclosure provides for a light detection and ranging (LIDAR) sensor system for a vehicle. The LIDAR sensor system includes: a light source configured to output a beam; a photonics integrated circuit (PIC) including a semiconductor die, the semiconductor die including a substrate having two or more semiconductor stacks respectively associated with two or more semiconductor devices formed on the substrate, the two or more semiconductor devices respectively configured to receive the beam from the light source and modify one or more features of the beam; a transmitter configured to receive the beam from the semiconductor die; and one or more optics configured to receive the beam from the transmitter and emit the beam towards an object.

In some implementations, the two or more semiconductor stacks include (e.g., each include) a plurality of layers.

In some implementations, the plurality of layers includes one or more first layers associated with a first semiconductor stack of the two or more semiconductor stacks and one or more second layers associated with a second semiconductor stack of the two or more semiconductor devices.

In some implementations, the one or more first layers include an n-doped group III-V semiconductor layer, a multiple quantum wells (MQW) layer, and a p-doped group III-V semiconductor layer.

In some implementations, the one or more second layers include an n-doped semiconductor layer.

In some implementations, the plurality of layers further includes one or more third layers associated with the first semiconductor stack and the second semiconductor stack.

In some implementations, the one or more third layers include one or more waveguide layers configured to propagate optical signals.

In some implementations, the one or more waveguide layers include group III-V semiconductor material providing improved transmission characteristics for the optical signals.

In some implementations, the one or more third layers include one or more spacer layers configured to isolate the one or more waveguide layers.

In some implementations, the one or more third layers include one or more insulating layers configured to insulate the two or more semiconductor stacks from outside electrical contact.

In some implementations, the two or more semiconductor stacks respectively define an optical mode.

In some implementations, the two or more semiconductor stacks are directly formed on the substrate.

In some implementations, the two or more semiconductor devices include at least one of: a modulator configured to modify a phase or a frequency of the beam; or an amplifier configured to modify an amplitude of the beam.

For example, in an aspect, the present disclosure provides for an autonomous vehicle (AV) control system. The AV control system includes one or more processors and a photonics integrated circuit (PIC) including a semiconductor die, the semiconductor die including a substrate having two or more semiconductor stacks respectively associated with two or more semiconductor devices directly formed on the substrate, the two or more semiconductor devices respectively configured to receive the beam from a light source and modify the beam.

In some implementations, the two or more semiconductor stacks include a plurality of layers, wherein the plurality of layers includes one or more first layers associated with a first semiconductor stack of the two or more semiconductor stacks and one or more second layers associated with a second semiconductor stack of the two or more semiconductor devices.

In some implementations, the one or more first layers include an n-doped group III-V semiconductor layer, a multiple quantum wells (MQW) layer, and a p-doped group III-V semiconductor layer; and the one or more second layers include an n-doped semiconductor layer.

In some implementations, the plurality of layers further includes one or more third layers associated with the first semiconductor stack and the second semiconductor stack.

In some implementations, the one or more third layers include one or more waveguide layers, the one or more layers waveguide layers configured to propagate optical signals.

In some implementations, the one or more third layers include one or more spacer layers disposed between the one or more waveguide layers, the one or more spacer layers configured to isolate the one or more waveguide layers.

For example, in an aspect, the present disclosure provides for an autonomous vehicle. The autonomous vehicle includes an autonomous vehicle control system. The autonomous vehicle control system includes one or more processors and a light detection and ranging (LIDAR) system. The LIDAR system includes: a light source configured to output a beam; a photonics integrated circuit (PIC) including a semiconductor die, the semiconductor die including a substrate having two or more semiconductor stacks respectively associated with two or more semiconductor devices directly formed on the substrate, the two or more semiconductor devices respectively configured to receive the beam from the light source and modify the beam; a transmitter configured to receive the beam from the semiconductor die; and one or more optics configured to receive the beam from the transmitter and emit the beam towards an object.

Other example aspects of the present disclosure are directed to other systems, methods, vehicles, apparatuses, tangible non-transitory computer-readable media, and devices for motion prediction and/or operation of a device including a LIDAR system having a LIDAR module according to example aspects of the present disclosure.

These and other features, aspects and advantages of various implementations of the present disclosure will become better understood with reference to the following description and appended claims. The accompanying drawings, which are incorporated in and constitute a part of this specification, illustrate implementations of the present disclosure and, together with the description, serve to explain the related principles.

DETAILED DESCRIPTION

The following describes the technology of this disclosure within the context of an autonomous vehicle for example purposes only. As described herein, the technology is not limited to an autonomous vehicle and can be implemented within other robotic and computing systems as well as various devices. For example, the systems and methods disclosed herein can be implemented in a variety of ways including, but not limited to, a computer-implemented method, an autonomous vehicle system, an autonomous vehicle control system, a robotic platform system, a general robotic device control system, a computing device, etc.

Figure 1:
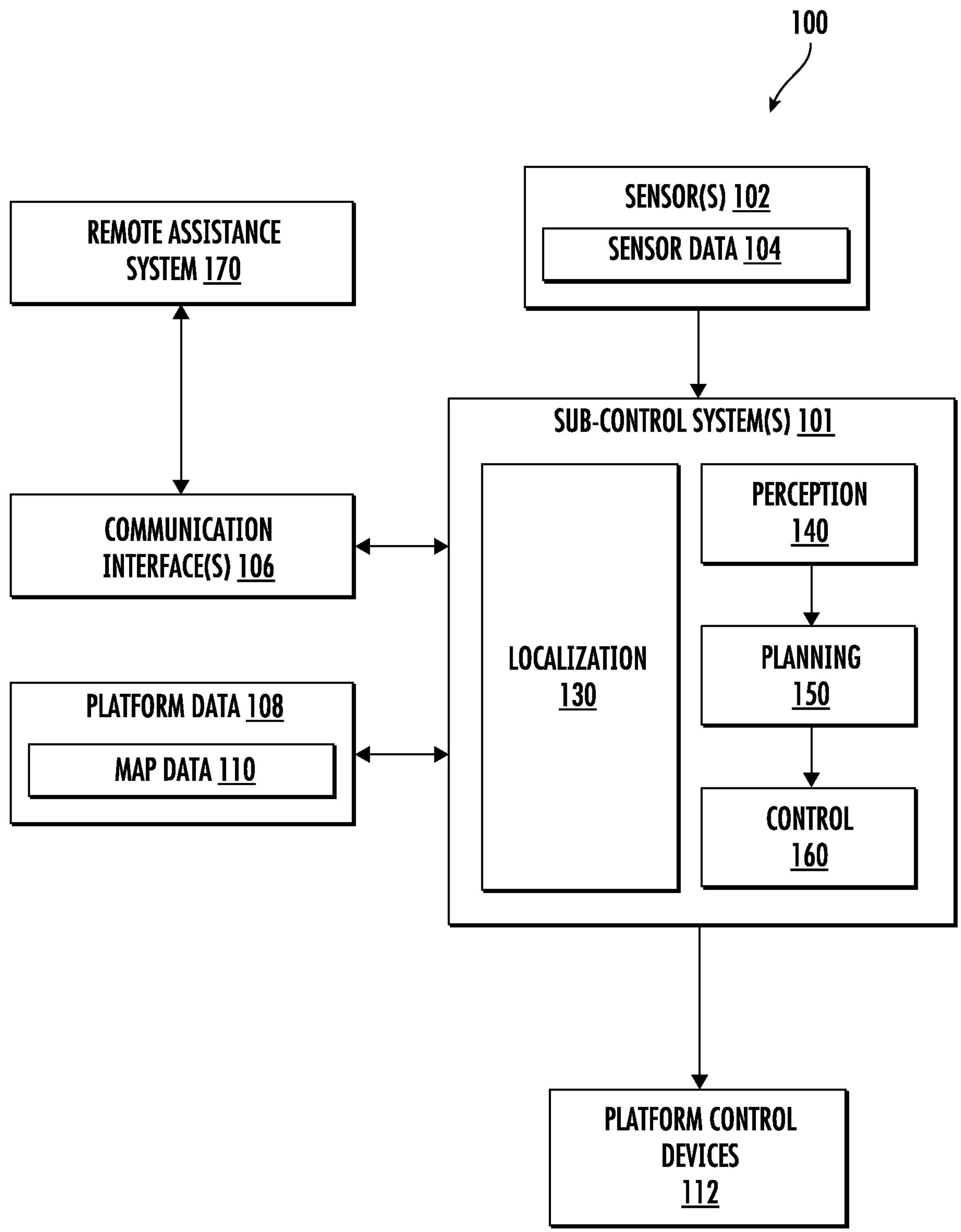
FIG. 1 depicts a block diagram of an example system according to some implementations of the present disclosure.

With reference to FIGS. 1-9, example implementations of the present disclosure are discussed in further detail. FIG. 1 depicts a block diagram of an example autonomous vehicle control system 100 for an autonomous vehicle according to some implementations of the present disclosure. The autonomous vehicle control system 100 can be implemented by a computing system of an autonomous vehicle). The autonomous vehicle control system 100 can include one or more sub-control systems 101 that operate to obtain inputs from sensor(s) 102 or other input devices of the autonomous vehicle control system 100. In some implementations, the sub-control system(s) 101 can additionally obtain platform data 108 (e.g., map data 110) from local or remote storage. The sub-control system(s) 101 can generate control outputs for controlling the autonomous vehicle (e.g., through platform control devices 112, etc.) based on sensor data 104, map data 110, or other data. The sub-control system 101 may include different subsystems for performing various autonomy operations. The subsystems may include a localization system 130, a perception system 140, a planning system 150, and a control system 160. The localization system 130 can determine the location of the autonomous vehicle within its environment; the perception system 140 can detect, classify, and track objects and actors in the environment; the planning system 150 can determine a trajectory for the autonomous vehicle; and the control system 160 can translate the trajectory into vehicle controls for controlling the autonomous vehicle. The sub-control system(s) 101 can be implemented by one or more onboard computing system(s). The subsystems can include one or more processors and one or more memory devices. The one or more memory devices can store instructions executable by the one or more processors to cause the one or more processors to perform operations or functions associated with the subsystems. The computing resources of the sub-control system(s) 101 can be shared among its subsystems, or a subsystem can have a set of dedicated computing resources.

In some implementations, the autonomous vehicle control system 100 can be implemented for or by an autonomous vehicle (e.g., a ground-based autonomous vehicle). The autonomous vehicle control system 100 can perform various processing techniques on inputs (e.g., the sensor data 104, the map data 110) to perceive and understand the vehicle's surrounding environment and generate an appropriate set of control outputs to implement a vehicle motion plan (e.g., including one or more trajectories) for traversing the vehicle's surrounding environment. In some implementations, an autonomous vehicle implementing the autonomous vehicle control system 100 can drive, navigate, operate, etc. with minimal or no interaction from a human operator (e.g., driver, pilot, etc.).

In some implementations, the autonomous vehicle can be configured to operate in a plurality of operating modes. For instance, the autonomous vehicle can be configured to operate in a fully autonomous (e.g., self-driving, etc.) operating mode in which the autonomous platform is controllable without user input (e.g., can drive and navigate with no input from a human operator present in the autonomous vehicle or remote from the autonomous vehicle, etc.). The autonomous vehicle can operate in a semi-autonomous operating mode in which the autonomous vehicle can operate with some input from a human operator present in the autonomous vehicle (or a human operator that is remote from the autonomous platform). In some implementations, the autonomous vehicle can enter into a manual operating mode in which the autonomous vehicle is fully controllable by a human operator (e.g., human driver, etc.) and can be prohibited or disabled (e.g., temporary, permanently, etc.) from performing autonomous navigation (e.g., autonomous driving, etc.). The autonomous vehicle can be configured to operate in other modes such as, for example, park or sleep modes (e.g., for use between tasks such as waiting to provide a trip/service, recharging, etc.). In some implementations, the autonomous vehicle can implement vehicle operating assistance technology (e.g., collision mitigation system, power assist steering, etc.), for example, to help assist the human operator of the autonomous platform (e.g., while in a manual mode, etc.).

The autonomous vehicle control system 100 can be located onboard (e.g., on or within) an autonomous vehicle and can be configured to operate the autonomous vehicle in various environments. The environment may be a real-world environment or a simulated environment. In some implementations, one or more simulation computing devices can simulate one or more of: the sensors 102, the sensor data 104, communication interface(s) 106, the platform data 108, or the platform control devices 112 for simulating operation of the autonomous vehicle control system 100.

In some implementations, the sub-control system(s) 101 can communicate with one or more networks or other systems with communication interface(s) 106. The communication interface(s) 106 can include any suitable components for interfacing with one or more network(s), including, for example, transmitters, receivers, ports, controllers, antennas, or other suitable components that can help facilitate communication. In some implementations, the communication interface(s) 106 can include a plurality of components (e.g., antennas, transmitters, or receivers, etc.) that allow it to implement and utilize various communication techniques (e.g., multiple-input, multiple-output (MIMO) technology, etc.).

In some implementations, the sub-control system(s) 101 can use the communication interface(s) 106 to communicate with one or more computing devices that are remote from the autonomous vehicle over one or more network(s). For instance, in some examples, one or more inputs, data, or functionalities of the sub-control system(s) 101 can be supplemented or substituted by a remote system communicating over the communication interface(s) 106. For instance, in some implementations, the map data 110 can be downloaded over a network to a remote system using the communication interface(s) 106. In some examples, one or more of the localization system 130, the perception system 140, the planning system 150, or the control system 160 can be updated, influenced, nudged, communicated with, etc. by a remote system for assistance, maintenance, situational response override, management, etc.

The sensor(s) 102 can be located onboard the autonomous platform. In some implementations, the sensor(s) 102 can include one or more types of sensor(s). For instance, one or more sensors can include image capturing device(s) (e.g., visible spectrum cameras, infrared cameras, etc.). Additionally or alternatively, the sensor(s) 102 can include one or more depth capturing device(s). For example, the sensor(s) 102 can include one or more LIDAR sensor(s) or Radio Detection and Ranging (RADAR) sensor(s). The sensor(s) 102 can be configured to generate point data descriptive of at least a portion of a three-hundred-and-sixty-degree view of the surrounding environment. The point data can be point cloud data (e.g., three-dimensional LIDAR point cloud data, RADAR point cloud data). In some implementations, one or more of the sensor(s) 102 for capturing depth information can be fixed to a rotational device in order to rotate the sensor(s) 102 about an axis. The sensor(s) 102 can be rotated about the axis while capturing data in interval sector packets descriptive of different portions of a three-hundred-and-sixty-degree view of a surrounding environment of the autonomous platform. In some implementations, one or more of the sensor(s) 102 for capturing depth information can be solid state.

The sensor(s) 102 can be configured to capture the sensor data 104 indicating or otherwise being associated with at least a portion of the environment of the autonomous vehicle. The sensor data 104 can include image data (e.g., 2D camera data, video data, etc.), RADAR data, LIDAR data (e.g., 3D point cloud data, etc.), audio data, or other types of data. In some implementations, the sub-control system(s) 101 can obtain input from additional types of sensors, such as inertial measurement units (IMUs), altimeters, inclinometers, odometry devices, location or positioning devices (e.g., GPS, compass), wheel encoders, or other types of sensors. In some implementations, the sub-control system(s) 101 can obtain sensor data 104 associated with particular component(s) or system(s) of the autonomous vehicle. This sensor data 104 can indicate, for example, wheel speed, component temperatures, steering angle, cargo or passenger status, etc. In some implementations, the sub-control system(s) 101 can obtain sensor data 104 associated with ambient conditions, such as environmental or weather conditions. In some implementations, the sensor data 104 can include multi-modal sensor data. The multi-modal sensor data can be obtained by at least two different types of sensor(s) (e.g., of the sensors 102) and can indicate static and/or dynamic object(s) or actor(s) within an environment of the autonomous vehicle. The multi-modal sensor data can include at least two types of sensor data (e.g., camera and LIDAR data). In some implementations, the autonomous vehicle can utilize the sensor data 104 for sensors that are remote from (e.g., offboard) the autonomous vehicle. This can include for example, sensor data 104 captured by a different autonomous vehicle.

The sub-control system(s) 101 can obtain the map data 110 associated with an environment in which the autonomous vehicle was, is, or will be located. The map data 110 can provide information about an environment or a geographic area. For example, the map data 110 can provide information regarding the identity and location of different travel ways (e.g., roadways, etc.), travel way segments (e.g., road segments, etc.), buildings, or other items or objects (e.g., lampposts, crosswalks, curbs, etc.); the location and directions of boundaries or boundary markings (e.g., the location and direction of traffic lanes, parking lanes, turning lanes, bicycle lanes, other lanes, etc.); traffic control data (e.g., the location and instructions of signage, traffic lights, other traffic control devices, etc.); obstruction information (e.g., temporary or permanent blockages, etc.); event data (e.g., road closures/traffic rule alterations due to parades, concerts, sporting events, etc.); nominal vehicle path data (e.g., indicating an ideal vehicle path such as along the center of a certain lane, etc.); or any other map data that provides information that assists an autonomous vehicle in understanding its surrounding environment and its relationship thereto. In some implementations, the map data 110 can include high-definition map information. Additionally or alternatively, the map data 110 can include sparse map data (e.g., lane graphs, etc.). In some implementations, the sensor data 104 can be fused with or used to update the map data 110 in real time.

The sub-control system(s) 101 can include the localization system 130, which can provide an autonomous vehicle with an understanding of its location and orientation in an environment. In some examples, the localization system 130 can support one or more other subsystems of the sub-control system(s) 101, such as by providing a unified local reference frame for performing, e.g., perception operations, planning operations, or control operations.

In some implementations, the localization system 130 can determine a current position of the autonomous vehicle. A current position can include a global position (e.g., respecting a georeferenced anchor, etc.) or relative position (e.g., respecting objects in the environment, etc.). The localization system 130 can generally include or interface with any device or circuitry for analyzing a position or change in position of an autonomous vehicle. For example, the localization system 130 can determine position by using one or more of: inertial sensors (e.g., inertial measurement unit(s), etc.), a satellite positioning system, radio receivers, networking devices (e.g., based on IP address, etc.), triangulation or proximity to network access points or other network components (e.g., cellular towers, Wi-Fi access points, etc.), or other suitable techniques. The position of the autonomous vehicle can be used by various subsystems of the sub-control system(s) 101 or provided to a remote computing system (e.g., using the communication interface(s) 106).

In some implementations, the localization system 130 can register relative positions of elements of a surrounding environment of the autonomous vehicle with recorded positions in the map data 110. For instance, the localization system 130 can process the sensor data 104 (e.g., LIDAR data, RADAR data, camera data, etc.) for aligning or otherwise registering to a map of the surrounding environment (e.g., from the map data 110) to understand the autonomous vehicle's position within that environment. Accordingly, in some implementations, the autonomous vehicle can identify its position within the surrounding environment (e.g., across six axes, etc.) based on a search over the map data 110. In some implementations, given an initial location, the localization system 130 can update the autonomous vehicle's location with incremental re-alignment based on recorded or estimated deviations from the initial location. In some implementations, a position can be registered directly within the map data 110.

In some implementations, the map data 110 can include a large volume of data subdivided into geographic tiles, such that a desired region of a map stored in the map data 110 can be reconstructed from one or more tiles. For instance, a plurality of tiles selected from the map data 110 can be stitched together by the sub-control system 101 based on a position obtained by the localization system 130 (e.g., a number of tiles selected in the vicinity of the position).

In some implementations, the localization system 130 can determine positions (e.g., relative or absolute) of one or more attachments or accessories for an autonomous vehicle. For instance, an autonomous vehicle can be associated with a cargo platform, and the localization system 130 can provide positions of one or more points on the cargo platform. For example, a cargo platform can include a trailer or other device towed or otherwise attached to or manipulated by an autonomous vehicle, and the localization system 130 can provide for data describing the position (e.g., absolute, relative, etc.) of the autonomous vehicle as well as the cargo platform. Such information can be obtained by the other autonomy systems to help operate the autonomous vehicle.

The sub-control system(s) 101 can include the perception system 140, which can allow an autonomous platform to detect, classify, and track objects and actors in its environment. Environmental features or objects perceived within an environment can be those within the field of view of the sensor(s) 102 or predicted to be occluded from the sensor(s) 102. This can include object(s) not in motion or not predicted to move (static objects) or object(s) in motion or predicted to be in motion (dynamic objects/actors).

The perception system 140 can determine one or more states (e.g., current or past state(s), etc.) of one or more objects that are within a surrounding environment of an autonomous vehicle. For example, state(s) can describe (e.g., for a given time, time period, etc.) an estimate of an object's current or past location (also referred to as position); current or past speed/velocity; current or past acceleration; current or past heading; current or past orientation; size/footprint (e.g., as represented by a bounding shape, object highlighting, etc.); classification (e.g., pedestrian class vs. vehicle class vs. bicycle class, etc.); the uncertainties associated therewith; or other state information. In some implementations, the perception system 140 can determine the state(s) using one or more algorithms or machine-learned models configured to identify/classify objects based on inputs from the sensor(s) 102. The perception system can use different modalities of the sensor data 104 to generate a representation of the environment to be processed by the one or more algorithms or machine-learned models. In some implementations, state(s) for one or more identified or unidentified objects can be maintained and updated over time as the autonomous vehicle continues to perceive or interact with the objects (e.g., maneuver with or around, yield to, etc.). In this manner, the perception system 140 can provide an understanding about a current state of an environment (e.g., including the objects therein, etc.) informed by a record of prior states of the environment (e.g., including movement histories for the objects therein). Such information can be helpful as the autonomous vehicle plans its motion through the environment.

The sub-control system(s) 101 can include the planning system 150, which can be configured to determine how the autonomous platform is to interact with and move within its environment. The planning system 150 can determine one or more motion plans for an autonomous platform. A motion plan can include one or more trajectories (e.g., motion trajectories) that indicate a path for an autonomous vehicle to follow. A trajectory can be of a certain length or time range. The length or time range can be defined by the computational planning horizon of the planning system 150. A motion trajectory can be defined by one or more waypoints (with associated coordinates). The waypoint(s) can be future location(s) for the autonomous platform. The motion plans can be continuously generated, updated, and considered by the planning system 150.

The planning system 150 can determine a strategy for the autonomous platform. A strategy may be a set of discrete decisions (e.g., yield to actor, reverse yield to actor, merge, lane change) that the autonomous platform makes. The strategy may be selected from a plurality of potential strategies. The selected strategy may be a lowest cost strategy as determined by one or more cost functions. The cost functions may, for example, evaluate the probability of a collision with another actor or object.

The planning system 150 can determine a desired trajectory for executing a strategy. For instance, the planning system 150 can obtain one or more trajectories for executing one or more strategies. The planning system 150 can evaluate trajectories or strategies (e.g., with scores, costs, rewards, constraints, etc.) and rank them. For instance, the planning system 150 can use forecasting output(s) that indicate interactions (e.g., proximity, intersections, etc.) between trajectories for the autonomous platform and one or more objects to inform the evaluation of candidate trajectories or strategies for the autonomous platform. In some implementations, the planning system 150 can utilize static cost(s) to evaluate trajectories for the autonomous platform (e.g., "avoid lane boundaries," "minimize jerk," etc.). Additionally or alternatively, the planning system 150 can utilize dynamic cost(s) to evaluate the trajectories or strategies for the autonomous platform based on forecasted outcomes for the current operational scenario (e.g., forecasted trajectories or strategies leading to interactions between actors, forecasted trajectories or strategies leading to interactions between actors and the autonomous platform, etc.). The planning system 150 can rank trajectories based on one or more static costs, one or more dynamic costs, or a combination thereof. The planning system 150 can select a motion plan (and a corresponding trajectory) based on a ranking of a plurality of candidate trajectories. In some implementations, the planning system 150 can select a highest ranked candidate, or a highest ranked feasible candidate.

The planning system 150 can then validate the selected trajectory against one or more constraints before the trajectory is executed by the autonomous platform.

To help with its motion planning decisions, the planning system 150 can be configured to perform a forecasting function. The planning system 150 can forecast future state(s) of the environment. This can include forecasting the future state(s) of other actors in the environment. In some implementations, the planning system 150 can forecast future state(s) based on current or past state(s) (e.g., as developed or maintained by the perception system 140). In some implementations, future state(s) can be or include forecasted trajectories (e.g., positions over time) of the objects in the environment, such as other actors. In some implementations, one or more of the future state(s) can include one or more probabilities associated therewith (e.g., marginal probabilities, conditional probabilities). For example, the one or more probabilities can include one or more probabilities conditioned on the strategy or trajectory options available to the autonomous vehicle. Additionally or alternatively, the probabilities can include probabilities conditioned on trajectory options available to one or more other actors.

To implement selected motion plan(s), the sub-control system(s) 101 can include a control system 160 (e.g., a vehicle control system). Generally, the control system 160 can provide an interface between the sub-control system(s) 101 and the platform control devices 112 for implementing the strategies and motion plan(s) generated by the planning system 150. For instance, the control system 160 can implement the selected motion plan/trajectory to control the autonomous platform's motion through its environment by following the selected trajectory (e.g., the waypoints included therein). The control system 160 can, for example, translate a motion plan into instructions for the appropriate platform control devices 112 (e.g., acceleration control, brake control, steering control, etc.). By way of example, the control system 160 can translate a selected motion plan into instructions to adjust a steering component (e.g., a steering angle) by a certain number of degrees, apply a certain magnitude of braking force, increase/decrease speed, etc. In some implementations, the control system 160 can communicate with the platform control devices 112 through communication channels including, for example, one or more data buses (e.g., controller area network (CAN), etc.), onboard diagnostics connectors (e.g., OBD-II, etc.), or a combination of wired or wireless communication links. The platform control devices 112 can send or obtain data, messages, signals, etc. to or from the sub-control system(s) 101 (or vice versa) through the communication channel(s).

The sub-control system(s) 101 can receive, through communication interface(s) 106, assistive signal(s) from remote assistance system 170. Remote assistance system 170 can communicate with the sub-control system(s) 101 over a network. In some implementations, the sub-control system(s) 101 can initiate a communication session with the remote assistance system 170. For example, the sub-control system(s) 101 can initiate a session based on or in response to a trigger. In some implementations, the trigger may be an alert, an error signal, a map feature, a request, a location, a traffic condition, a road condition, etc.

After initiating the session, the sub-control system(s) 101 can provide context data to the remote assistance system 170. The context data may include sensor data 104 and state data of the autonomous vehicle. For example, the context data may include a live camera feed from a camera of the autonomous vehicle and the autonomous vehicle's current speed. An operator (e.g., human operator) of the remote assistance system 170 can use the context data to select assistive signals. The assistive signal(s) can provide values or adjustments for various operational parameters or characteristics for the sub-control system(s) 101. For instance, the assistive signal(s) can include way points (e.g., a path around an obstacle, lane change, etc.), velocity or acceleration profiles (e.g., speed limits, etc.), relative motion instructions (e.g., convoy formation, etc.), operational characteristics (e.g., use of auxiliary systems, reduced energy processing modes, etc.), or other signals to assist the sub-control system(s) 101.

The sub-control system(s) 101 can use the assistive signal(s) for input into one or more autonomy subsystems for performing autonomy functions. For instance, the planning system 150 can receive the assistive signal(s) as an input for generating a motion plan. For example, assistive signal(s) can include constraints for generating a motion plan. Additionally or alternatively, assistive signal(s) can include cost or reward adjustments for influencing motion planning by the planning system 150. Additionally or alternatively, assistive signal(s) can be considered by the sub-control system(s) 101 as suggestive inputs for consideration in addition to other received data (e.g., sensor inputs, etc.).

The sub-control system(s) 101 may be platform agnostic, and the control system 160 can provide control instructions to platform control devices 112 for a variety of different platforms for autonomous movement (e.g., a plurality of different autonomous platforms fitted with autonomous control systems). This can include a variety of different types of autonomous vehicles (e.g., sedans, vans, SUVs, trucks, electric vehicles, combustion power vehicles, etc.) from a variety of different manufacturers/developers that operate in various different environments and, in some implementations, perform one or more vehicle services.

Figure 2:
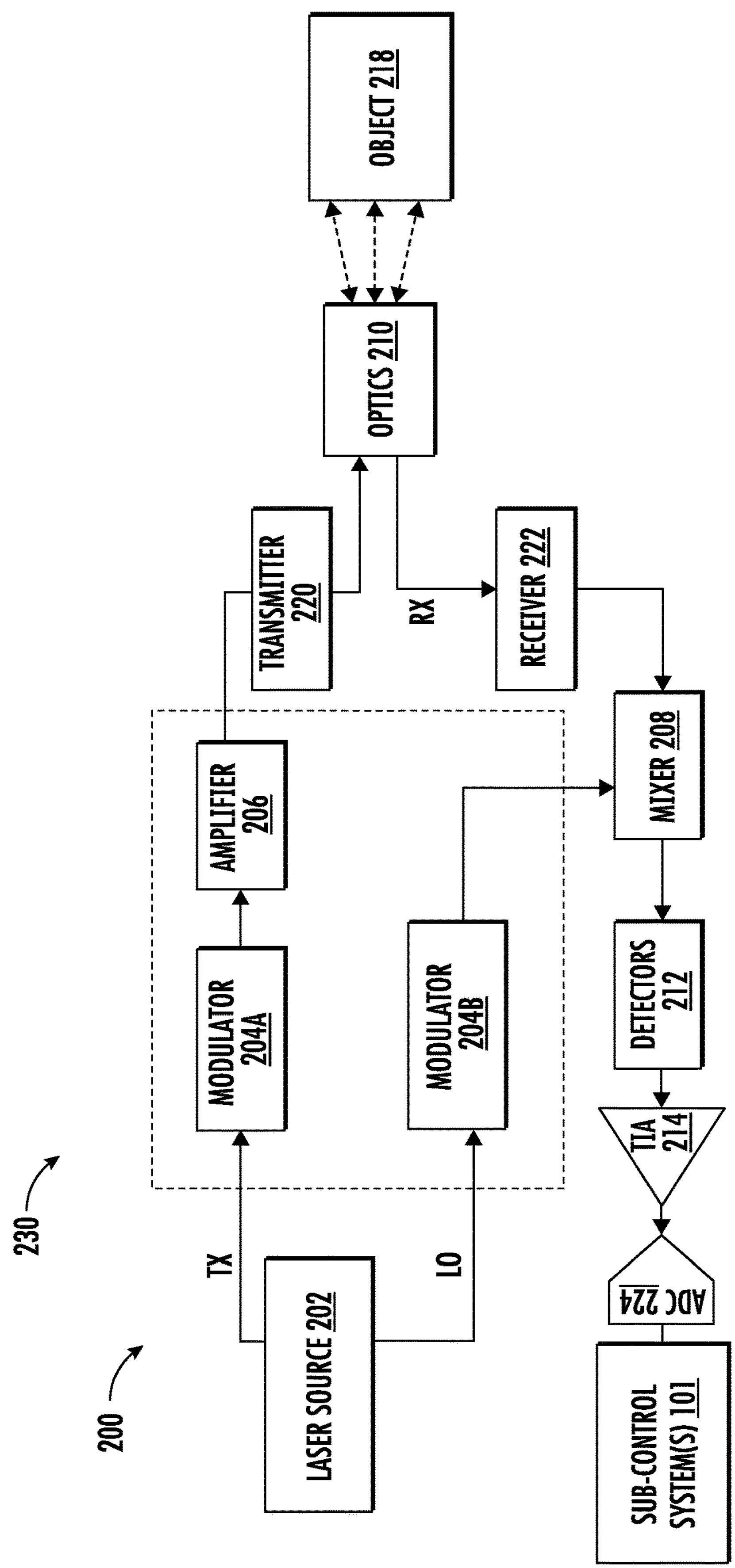
FIG. 2 depicts a block diagram of an example LIDAR system according to some implementations of the present disclosure.

FIG. 2 is a block diagram illustrating an example LIDAR sensor system for autonomous vehicles, according to some implementations. The environment includes a LIDAR system 200 that includes a transmit (Tx) path and a receive (Rx) path. The Tx path includes one or more Tx input/output ports, and the Rx path includes one or more Rx input/output ports. In some implementations, a semiconductor substrate and/or semiconductor package may include the Tx path and the Rx. In some implementations, the semiconductor substrate and/or semiconductor package may include at least one of silicon photonics circuitry, programmable logic controller (PLC), or III-V semiconductor circuitry.

In some implementations, a first semiconductor substrate and/or a first semiconductor package may include the Tx path and a second semiconductor substrate and/or a second semiconductor package may include the Rx path. In some arrangements, the Rx input/output ports and/or the Tx input/output ports may occur (or be formed/disposed/located/placed) along one or more edges of one or more semiconductor substrates and/or semiconductor packages.

The LIDAR system 200 includes one or more transmitters 220 and one or more receivers 222. The LIDAR system 200 further includes one or more optics 210 (e.g., an oscillatory scanner, a unidirectional scanner, a Risley prism, a circulator optic, and/or a beam collimator, etc.) that are coupled to the LIDAR system 200 (e.g., the transmitter 220 and/or receiver 222). In some implementations, the one or more optics 210 may be coupled to the Tx path via the one or more Tx input/output ports. In some implementations, the one or more optics 210 may be coupled to the Rx path via the one or more Rx input/output ports.

The LIDAR system 200 can be coupled to one or more sub-control system(s) 101—(e.g., the sub-control system(s) 101 of FIG. 1). In some implementations, the sub-control system(s) 101 may be coupled to the Rx path via the one or more Rx input/output ports. For instance, the sub-control system(s) 101 can receive LIDAR outputs from the LIDAR system 200. The sub-control system(s) 101 can control a vehicle (e.g., an autonomous vehicle) based on the LIDAR outputs.

The Tx path may include a laser source 202, a modulator 204A, a modulator 204B, an amplifier 206, and one or more transmitters 220. The Rx path may include one or more receivers 222, a mixer 208, a detector 212, a transimpedance amplifier (TIA) 214, and one or more analog-to-digital converters (ADCs). Although FIG. 2 shows only a select number of components and only one input/output channel, the LIDAR system 200 may include any number of components and/or input/output channels (in any combination) that are interconnected in any arrangement to facilitate combining multiple functions of a LIDAR system, to support the operation of a vehicle.

The laser source 202 may be configured to generate a light signal (or beam) that is derived from (or associated with) a local oscillator (LO) signal. In some implementations, the light signal may have an operating wavelength that is equal to or substantially equal to 1550 nanometers. In some implementations, the light signal may have an operating wavelength that is between 1400 nanometers and 1440 nanometers.

The laser source 202 may be configured to provide the light signal to the modulator 204A, which is configured to modulate a phase and/or a frequency of the light signal based on a first radio frequency (RF) signal (e.g., an "RF1" signal) to generate a modulated light signal, such as by Continuous Wave (CW) modulation or quasi-CW modulation. The modulator 204A may be configured to send the modulated light signal to the amplifier 206. The amplifier 206 may be configured to amplify the modulated light signal to generate an amplified light signal to the optics 210 via the one or more transmitters 220. The one or more transmitters 220 may include one or more optical waveguides or antennas. In some implementations, modulator 204A and/or modulator 204B may have a bandwidth between 400 megahertz (MHz) and 1000 (MHz).

According to example aspects of the present disclosure, the modulator 204A, the modulator 204B, and/or the amplifier 206 can be disposed in a photonics integrated circuit (PIC) 230. The photonics integrated circuit 230 can include one or more semiconductor devices (e.g., the modulator 204A/204B and/or the amplifier 206) formed on a common substrate. Furthermore, the different semiconductor devices can have differing semiconductor stacks. For example, the modulator 204A can have a first semiconductor stack while the amplifier 206 can have a second semiconductor stack. Additionally or alternatively, the amplifier can be formed of a group III-V semiconductor stack while the modulator 204 can be formed of another semiconductor material (e.g., silicon).

The optics 210 may be configured to steer the amplified light signal that it receives from the Tx path into an environment within a given field of view toward an object 218, may receive a returned signal reflected back from the object 218, and provide the returned signal to the mixer 208 of the Rx path via the one or more receivers 222. The one or more receivers 22 may include one or more optical waveguides or antennas. In some arrangements, the transmitters 220 and the receivers 222 may collectively constitute one or more transceivers. In some arrangements, the one or more transceivers may include a monostatic transceiver or a bistatic transceiver.

The laser source 202 may be configured to provide the LO signal to the modulator 204B, which is configured to modulate a phase and/or a frequency of the LO signal based on a second RF signal (e.g., an "RF2" signal) to generate a modulated LO signal (e.g., using Continuous Wave (CW) modulation or quasi-CW modulation) and send the modulated LO signal to the mixer 208 of the Rx path. The mixer 208 may be configured to mix (e.g., combine, multiply, etc.) the modulated LO signal with the returned signal to generate a down-converted signal and send the down-converted signal to the detector 212.

In some arrangements, the mixer 208 may be configured to send the modulated LO signal to the detector 212. The detector 212 may be configured to generate an electrical signal based on the down-converted signal and send the electrical signal to the TIA 214. In some arrangements, the detector 212 may be configured to generate an electrical signal based on the down-converted signal and the modulated signal. The TIA 214 may be configured to amplify the electrical signal and send the amplified electrical signal to the sub-control system(s) 101 via the one or more ADCs 224. In some implementations, the TIA 214 may have a peak noise-equivalent power (NEP) that is less than 5 picowatts per square root Hertz (i.e., 5×10-12 Watts per square root Hertz). In some implementations, the TIA 214 may have a gain between 4 kiloohms and 25 kiloohms. In some implementations, detector 212 and/or TIA 214 may have a 3-decibel bandwidth between 80 kilohertz (kHz) and 450 megahertz (MHz).

The sub-control system(s) 101 may be configured to determine a distance to the object 218 and/or measure the velocity of the object 218 based on the one or more electrical signals that it receives from the TIA via the one or more ADCs 224.

Figure 3:
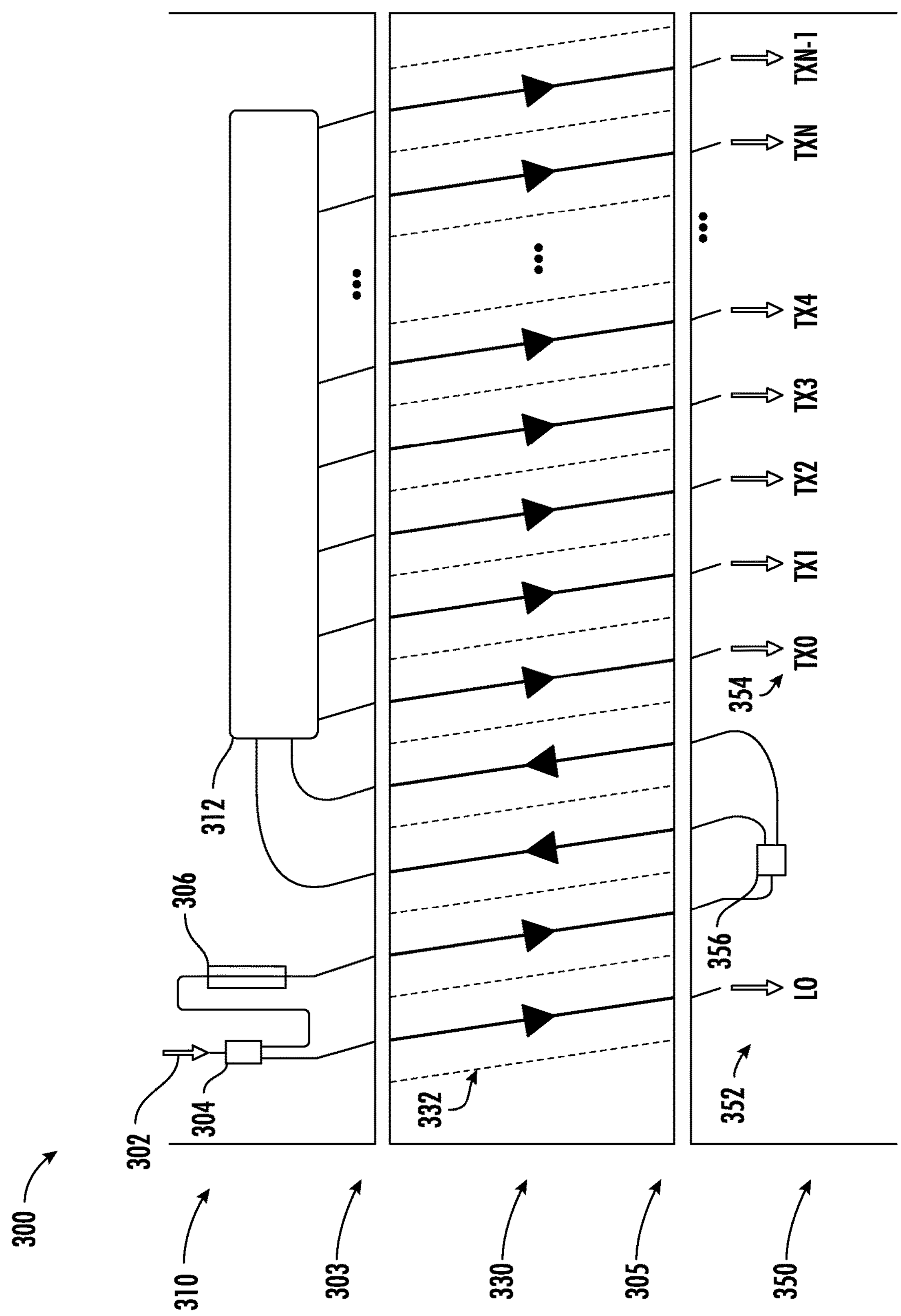
FIG. 3 depicts an example photonics integrated circuit according to some implementations of the present disclosure.

FIG. 3 depicts an example photonics integrated circuit 300 (PIC 300) according to some implementations of the present disclosure. The PIC 300 can be included in a LIDAR system, such as the LIDAR system 200 of FIG. 2.

The PIC 300 can include a semiconductor die 330. The semiconductor die 330 can include a substrate having two or more semiconductor devices directly formed on the substrate. For instance, in some implementations, the semiconductor devices can each be formed on a common substrate of the semiconductor die 330. The substrate, the semiconductor devices, and/or the semiconductor die can be formed of a group III-V semiconductor material, such as, for example, indium phosphide (InP), gallium arsenide (GaAs), indium arsenide (InAs), gallium nitride (GaN), or indium antimonide (InSb). Group III-V semiconductors are based on the elements of groups III and V of the periodic table. The possibility to grow thin-films made of group III-V alloys with different fractions of their constituent elements allows for precise engineering of optical properties. In addition, since many III-V compounds are direct-bandgap semiconductors, they may be suitable for the development of photonic devices and integrated circuits for use in optical systems such as LIDAR systems.

According to example aspects of the present disclosure, the respective semiconductor stacks of the one or more semiconductor devices of the semiconductor die 330 are not coupled by any butt joints or other joining process. For instance, in conventional manufacturing processes, disparate semiconductor stacks may be joined by butt joints or other joining processes to assemble a PIC. Rather, the semiconductor stacks are directly formed on a common substrate by a manufacturing process such as MOVCD, where layers of the semiconductor stack are formed on each semiconductor device (e.g., by a deposition process), and etched away from semiconductor stacks for devices that do not include the layer. As used herein, a semiconductor stack refers to a plurality of layers of materials, such as semiconductor materials, formed on or extending from a substrate or wafer. A respective semiconductor stack may form, compose, or otherwise make up a respective semiconductor device, such as a modulator, amplifier, or other suitable semiconductor device. Respective semiconductor stacks may be separated by surface features of the substrate, such as trench features.

The semiconductor die 330 can be coupled to at least one photonics die. For instance, the semiconductor die 330 can be coupled to a first photonics die 310 by a first optical interface 303. The semiconductor die 330 can additionally or alternatively be coupled to a second photonics die 350 by a second optical interface 305. The optical interface(s) 303, 305 can be configured such that waveguides, lenses, or other structures for transmitting signals (e.g., electrical signals, light or laser signals, etc.) between the semiconductor die 330 and the first and second photonics dies 310, 350. The photonics dies 310, 350 can be silicon photonics dies. For instance, the photonics dies 310, 350 can be formed on a silicon substrate and/or formed of silicon layers.

Components depicted on the first photonics die 310 and second photonics die 350 are arranged as in FIG. 3 for the purpose of illustrating example aspects of the present disclosure. It should be understood by one having ordinary skill in the art that some components depicted on the first photonics die 310 may be positioned on the second photonics die 350 and components depicted on the second photonics die 350 may be positioned on the first photonics die 310 without deviating from the present disclosure. Still further, more or fewer photonics dies can be coupled to semiconductor die 330 without deviating from the present disclosure.

The first photonics die 310 can include or otherwise be in signal communication with a light source (e.g., laser source) 302. The laser source 302 can be configured to provide a beam (e.g., a laser beam) to the first photonics die 310 and the PIC 300. In some implementations, a local oscillator (LO) output 352 may be drawn from the laser source 302. The LO output 352 may be equivalent to the laser source 302 or may be modulated from the laser source 302 (e.g., by an LO modulator such as modulator 204B of FIG. 2). In particular, the first photonics die 310 can include a splitter 304 configured to split the beam from laser source 302 into a first beam provided to the LO output 352 and a second beam provided to other components of the PIC 300.

The laser source 302 can provide the beam to a modulator 306 (e.g., a phase modulator). The modulator 306 can be configured to modulate the beam to modify a phase and/or a frequency of the beam. In some embodiments, the modulator 306 can be a silicon phase modulator. The modulator 306 can modulate the beam by, for example, using Continuous Wave (CW) modulation or quasi-CW modulation. In some implementations, the modulator 306 can be disposed on the first photonics die 310.

The beam can be provided to one or more channels 332 of the semiconductor die 330. For instance, the channels 332 can be, can include, or can be a portion of a semiconductor device of the semiconductor die 330 configured to modify (e.g., modulate, amplify, etc.) the beam as it passes through the channels 332. For example, the channels 332 can be or can include amplification channels configured to amplify the beam as it passes through the channel. As another example, the channels 332 can be or can include modulation channels configured to modify the beam as it passes through the channels 332.

The PIC 300 (e.g., the first photonics die 310) can include a power distribution network 312. The power distribution network 312 can be configured to distribute the beam to the channels 332 of the semiconductor die 330. For instance, the power distribution network 312 can distribute the beam among the channels 332 based on power needs of the LIDAR system. Furthermore, in some implementations, the PIC 300 (e.g., the second photonics die 350) can include a splitter 356 disposed prior to the power distribution network 312 along the path of the beam through the PIC 300. Including a splitter 356 can reduce the magnitude of splitting that is later performed by power distribution network 312, which can in turn improve saturation of amplifiers in the channels 332.

The PIC 300 can further include or be in communication with a transmitter configured to receive the beam from the semiconductor die 330. For instance, in some implementations, the second photonics die 350 can include a transmitter (not illustrated in FIG. 3) configured to receive the beam from the semiconductor die 330 (e.g., the channels 332 of the semiconductor die 330). The second photonics die 350 can include one or more Tx outputs 354 (e.g., Tx0, Tx1, etc.) corresponding to output channels of a LIDAR system. The Tx outputs 354 can be provided to the transmitter and optics to emit the beam from the LIDAR system.

Furthermore, in some implementations, a photonics die (e.g., the photonics die 350) can include a receiver configured to receive a reflected beam from one or more optics. The reflected beam can be reflected from a target. For instance, the optics can emit a beam from the transmitter at a target, which is reflected by the target. The optics can capture the reflected beam and provide it to the receiver. In some implementations, the transmitter and the receiver can collectively be disposed on a common photonics die (e.g., a transceiver die).

In some implementations, the semiconductor die 330 can have a particular facet. An input of at least a first channel of the one or more channels and an output of at least a second channel of the one or more channels can be positioned on the particular facet of the semiconductor die 330. For instance, the input of the first channel and the output of the second channel can be positioned on the same facet (e.g., the same side) of the semiconductor die 330. In this manner, the PIC 300 can include one or more "u-turns" such that an optical signal input at the first channel is redirected in a direction back towards the input as it is output at the second channel. For instance, one or more waveguides on the semiconductor die 330 (and/or the photonics dies 310 or 350) can adjust a direction of propagation of the beams input at a first direction to be substantially parallel to a second direction that is substantially opposite the first direction. In this manner, the light guided by the waveguides performs a "u-turn" back toward the inputs (e.g., towards the photonics die 310 or 350).

Figure 4:
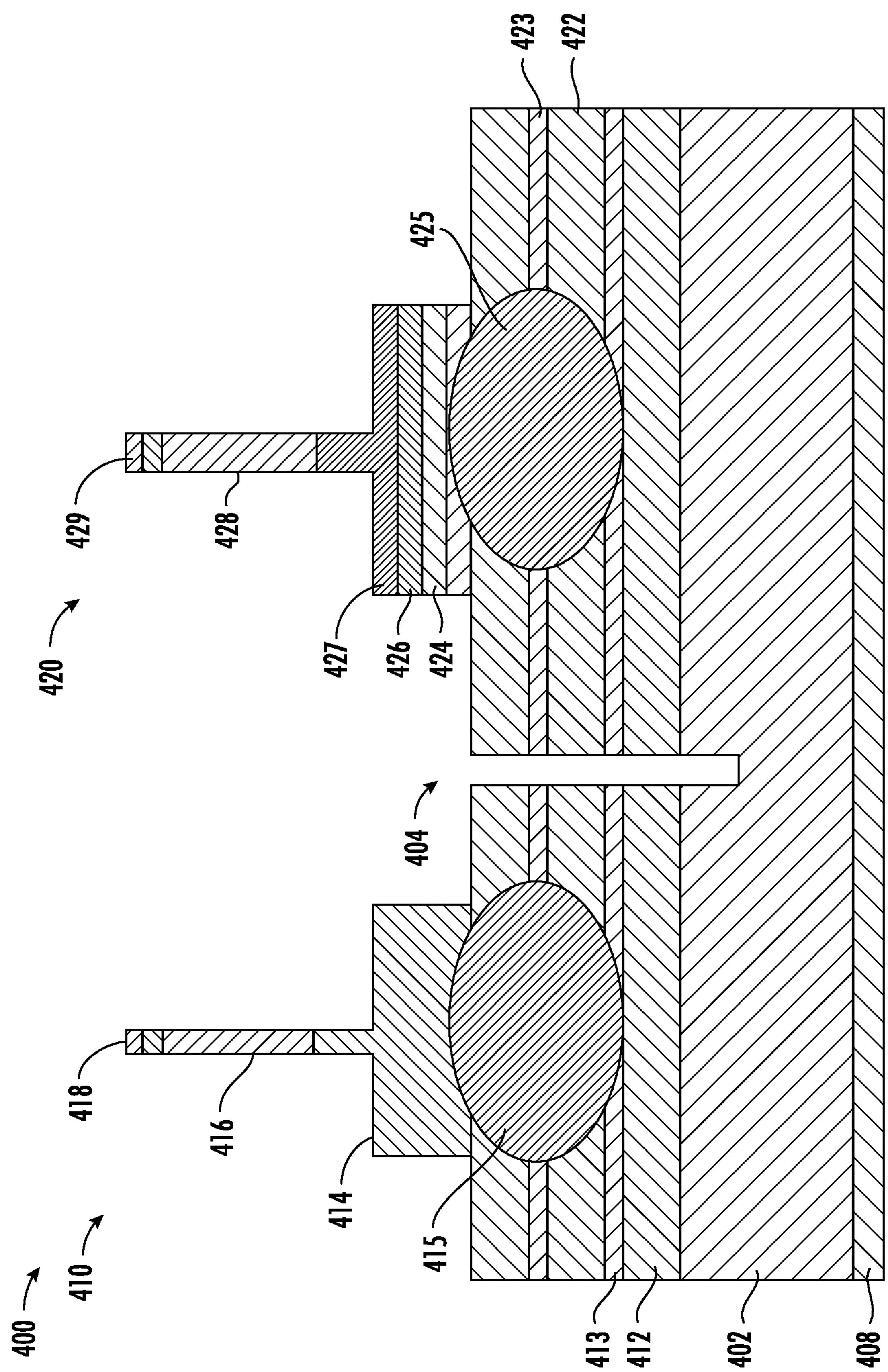
FIG. 4 depicts an example photonics integrated circuit according to some implementations of the present disclosure.

FIG. 4 depicts a cross-sectional view of an example semiconductor die 400 according to some implementations of the present disclosure. The semiconductor die 400 can be included in a LIDAR system, such as the LIDAR system 200 of FIG. 2.

The semiconductor die 400 can include a first semiconductor stack 410 (e.g., corresponding to a first semiconductor device) and a second semiconductor stack 420 (e.g., corresponding to a second semiconductor device) formed on a common substrate 402. The substrate 402 can be a metal substrate or semiconductor substrate, such as a substrate formed of crystalline silicon. As used herein, a semiconductor stack (e.g., 410, 420) refers to a plurality of layers of materials, such as semiconductor materials, formed on or extending from a substrate or wafer. A respective semiconductor stack may form, compose, or otherwise make up a respective semiconductor device, such as a modulator, amplifier, or other suitable semiconductor device. Respective semiconductor stacks may be separated by surface features of the substrate, such as trench features.

The first semiconductor stack 410 can have one or more waveguide layers 412. The second semiconductor stack 420 can have one or more waveguide layers 422. The waveguide layers 412, 422 can be configured to pass or propagate an optical signal (e.g., from a laser source) through the semiconductor stacks 410, 420. In some implementations, the waveguide layers 412, 422 can be formed of a group III-V semiconductor material. For instance, the group III-V semiconductor material can be or can include indium phosphide (InP), gallium arsenide (GaAs), indium arsenide (InAs), gallium nitride (GaN), indium antimonide (InSb), or another group III-V semiconductor material. The use of a group III-V material can, in some cases, provide improved transmission characteristics for optical signals. A thickness of the waveguide layers 412, 422 can facilitate conductivity and thermal dissipation. In some implementations, the thickness of the waveguide layers 412, 422 can be from about 100 microns to about 300 microns.

In some implementations, the waveguide layers 412, 422 can be separated by one or more spacer layers 413, 423. The spacer layers 413, 423 can be formed of silicon dioxide ($SiO_2$) or another suitable material. As another example, in some implementations, the spacer layers can be formed of a group III-V semiconductor material, such as a different group III-V semiconductor material than the waveguide layers 412, 422. The spacer layers 413, 423 can have a thickness of from about 100 microns to about 300 microns.

The first semiconductor stack 410 includes an n-doped semiconductor layer 414, a p-doped group III-V semiconductor layer (e.g., InP) 416, and an insulating layer 418. The n-doped semiconductor layer 414 can be formed of any suitable semiconductor, such as a group III-V semiconductor, silicon, etc. The n-doped semiconductor layer 414 can be doped with any suitable n-dopant, such as phosphorous, silicon, zinc, arsenic, or other suitable material. The n-doped semiconductor layer 414 can have any suitable thickness, such as a thickness of between about 10 and about 500 microns. The p-doped group III-V semiconductor layer 416 can be formed of any suitable group III-V semiconductor. The p-doped group III-V semiconductor layer 416 can be doped with any suitable p-dopant, such as boron, silicon, zinc, indium, or other suitable dopant. The p-doped group III-V semiconductor layer 416 can have any suitable thickness, such as a thickness of between about 10 and about 500 microns. The insulating layer 418 can insulate the layers of the first semiconductor stack 410 from outside electrical contact. The insulating layer 418 can be formed of any suitable insulating material, such as titanium, etc.

The second semiconductor stack 420 includes an n-doped group III-V semiconductor (e.g., InP) layer 424, a multiple quantum wells (MQW) layer 426, a p-doped group III-V semiconductor (e.g., InP) layer 427, a p-doped group III-V semiconductor layer 428, and an insulating layer 429. The n-doped semiconductor layer 424 can be formed of any suitable semiconductor, such as a group III-V semiconductor, silicon, etc. The n-doped semiconductor layer 424 can be doped with any suitable n-dopant, such as phosphorus, silicon, zinc, arsenic, or other suitable dopant. The n-doped semiconductor layer 424 can have any suitable thickness, such as a thickness of between about 10 and about 500 microns. The MQW layer 426 can provide a plurality of quantum wells having barriers with a thickness such that adjacent wave functions may not couple. The p-doped group III-V semiconductor layer(s) 427, 428 can be formed of any suitable group III-V semiconductor. The p-doped group III-V semiconductor layer(s) 427, 428 can be doped with any suitable p-dopant, such as boron, silicon, zinc, indium, or other suitable dopant. The p-doped group III-V semiconductor layer(s) 427, 428 can have any suitable thickness, such as a thickness of between about 10 and about 500 microns. The insulating layer 429 can insulate the layers of the second semiconductor stack 420 from outside electrical contact. The insulating layer 429 can be formed of any suitable insulating material, such as titanium, etc.

While the layers of semiconductor stacks 410, 420 have been described above with specific materials, it should be understood that the layers may be constructed of other materials, including but not limited to, indium phosphide (InP), gallium arsenide (GaAs), indium arsenide (InAs), gallium nitride (GaN), or indium antimonide (InSb).

The first semiconductor stack 410 and second semiconductor stack 420 can be isolated by a deep ridge etch 404. For instance, the deep ridge etch 404 can be etched from the top of the semiconductor die 400 to the surface of the substrate 402. The deep ridge etch 404 can isolate the first semiconductor stack 410 from the second semiconductor stack 420 such that each stack 410, 420 acts as an independent semiconductor device. For instance, light may not travel to/from the first semiconductor stack 410 from/to the second semiconductor stack 420 without passing through an adjacent component (e.g., a photonics die).

The optical modes 415, 425 represent an intensity profile of light within the semiconductor stacks 410, 420. The formation of the semiconductor die 400, such as the deep ridge etch 404, the width of the upper layers such as the n-doped semiconductor layer 414, the P-doped semiconductor layer 416, the MQW layer 426, etc. can produce optical modes 415, 425 in the semiconductor die 400 that are primarily concentrated in the waveguide layers 412, 422. For instance, the width of the upper layers, such as the n-doped semiconductor layer 414, the P-doped semiconductor layer 416, the MQW layer 426, etc. may generally increase for layers closer to the substrate 402, forming a "pyramid" or "step" configuration. This configuration can cause the optical modes 415, 425 to concentrate in the wider layers near the base of the semiconductor stacks 410, 420. The greater width, in turn, can increase an amount of light that is able to propagate through the semiconductor stacks 410, 420, thereby improving efficiency of the semiconductor die 400. The optical modes 415, 425 can be aligned with waveguides on adjacent components, such as silicon photonics dies.

The substrate 402 can have an antireflection layer 408 formed on a surface opposite the first semiconductor stack 410 and/or the second semiconductor stack 420. The antireflection layer 408 can be formed of a material having a low reflectivity such that the antireflection layer 408 does not reflect a significant amount of light incident on the semiconductor die 400.

Additionally or alternatively, in some implementations, the antireflection layer 408 can be nonuniformly applied to the surface of the substrate 402 such that the antireflection layer 408 provides a smooth surface. For instance, the thickness of the antireflection layer 408 may be nonuniform such that the antireflection layer 408 compensates for variations in uniformity of the substrate 402 and/or the semiconductor stacks 410, 420, such as, for example, warping, uneven deposition, etc. caused by manufacturing processes.

The antireflection layer 408 can be applied to facilitate alignment between the semiconductor die 400 and other components of the LIDAR sensor system (e.g., the photonics dies, etc.). For instance, the antireflection layer 408 can be applied such that the optical modes 415, 425 of the semiconductor stacks 410, 420 are aligned with waveguides or other signal transmission modes of adjacent components (e.g., the photonics dies, etc.).

Figure 5:
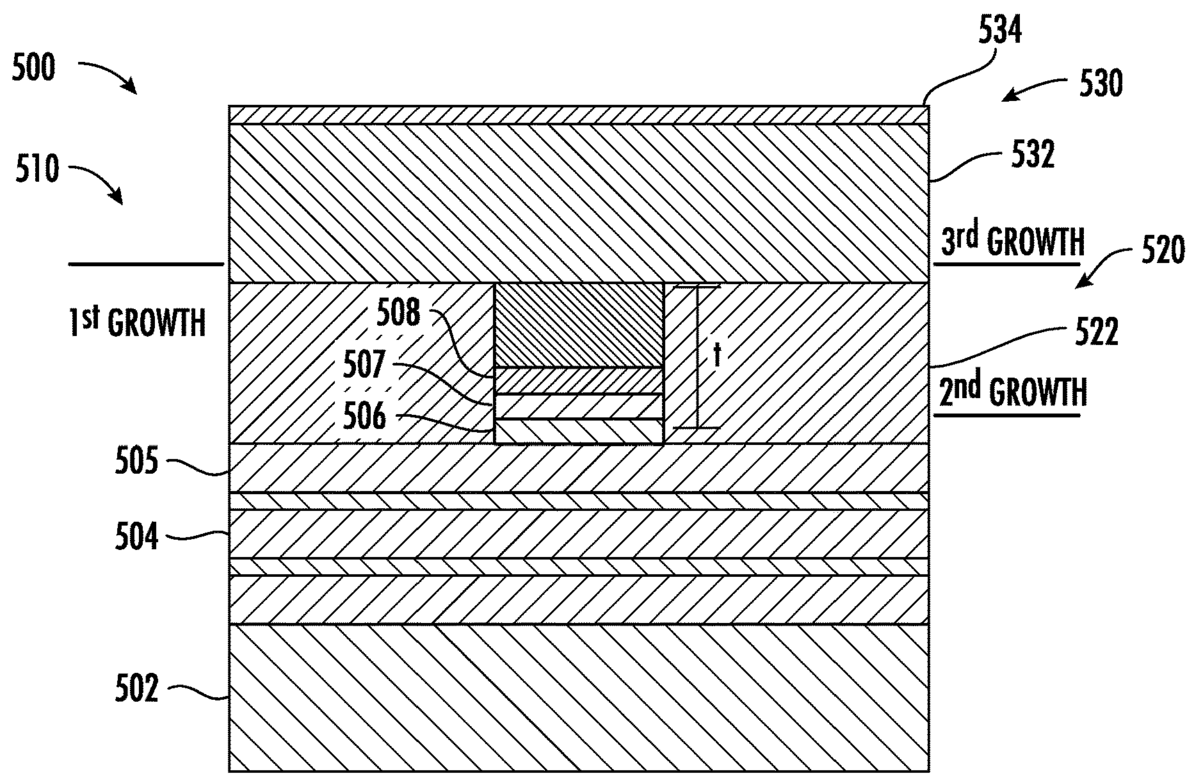
FIG. 5 depicts an example photonics integrated circuit according to some implementations of the present disclosure.

FIGS. 5 through 8 depict various stages of manufacturing the semiconductor die 400 of FIG. 4, according to some implementations of the present disclosure. For instance, FIG. 5 depicts a cross-sectional view of an intermediary semiconductor die 500 according to some implementations of the present disclosure. The semiconductor die 500 can be manufactured into a semiconductor die (e.g., the semiconductor die 400) that can be included in a LIDAR system, such as the LIDAR system 200 of FIG. 2. In particular, FIG. 5 depicts varying growth stages for the manufacturing process of the intermediary semiconductor die 500.

The semiconductor die 500 can be subjected to a first growth stage 510. At this stage, one or more first layers can be grown on a substrate 502. The one or more first layer(s) can be grown by any suitable growth or regrowth process, such as, for example, metal-organic chemical vapor deposition (MOVCD). The one or more first layer(s) can include one or more waveguide layers 504, one or more spacer layers 505, an n-doped group III-V semiconductor (e.g., InP) layer 506, a multiple quantum wells (MQW) layer 507, and a p-doped group III-V semiconductor (e.g., INP) layer 508. For instance, the one or more first layer(s) can correspond to the layers of a first semiconductor stack (or first plurality of semiconductor stacks) to be formed on the substrate 502. During the first growth stage 510, these one or more first layer(s) can be formed across the entire surface of the substrate 502 exposed to the growth process. This can include portions of the surface of the substrate 502 that will eventually become a second semiconductor stack.

After the first growth process, the portions of at least some of the one or more first layer(s) that are not associated with the first semiconductor stack can be etched away. For instance, a mask can be formed on the portions of the first layer(s) that are associated with the first semiconductor stack such that the portions of the first layer(s) associated with the first semiconductor stack remain after the etch process is complete. Any of the one or more first layer(s) that are common to each semiconductor stack (e.g., the waveguide layers 504 and/or spacer layers 505) may not be etched.

After etching away an etched portion of the one or more first layer(s) not associated with the first semiconductor stack, the semiconductor die 500 can be subjected to a second growth stage 520. During the second growth stage 520, one or more second layer(s) are grown in the etched portions of the first layers. For instance, in the example of FIG. 5, the n-doped group III-V semiconductor (e.g., InP) layer 506, multiple quantum wells (MQW) layer 507, and p-doped group III-V semiconductor (e.g., InP) layer 508 are etched away at a depth (t) and replaced with a n-doped semiconductor layer 522 in the second growth stage 520. After the second growth stage 520, a second etch process may be performed on areas of the first semiconductor stack such that the one or more second layer(s) are not present in the first semiconductor stack after the second etch process.

The semiconductor die 500 can then be subjected to a third growth stage 530. At this stage, one or more third layer(s) can be grown on the surface of the substrate 502 (e.g., on top of the first and/or second layer(s)). In some implementations, the one or more third layer(s) may be common to some or all of the semiconductor stacks on the semiconductor die 500. For instance, the one or more third layer(s) can include a p-doped group III-V semiconductor layer 532 and/or an insulating layer 534.

Figure 6:
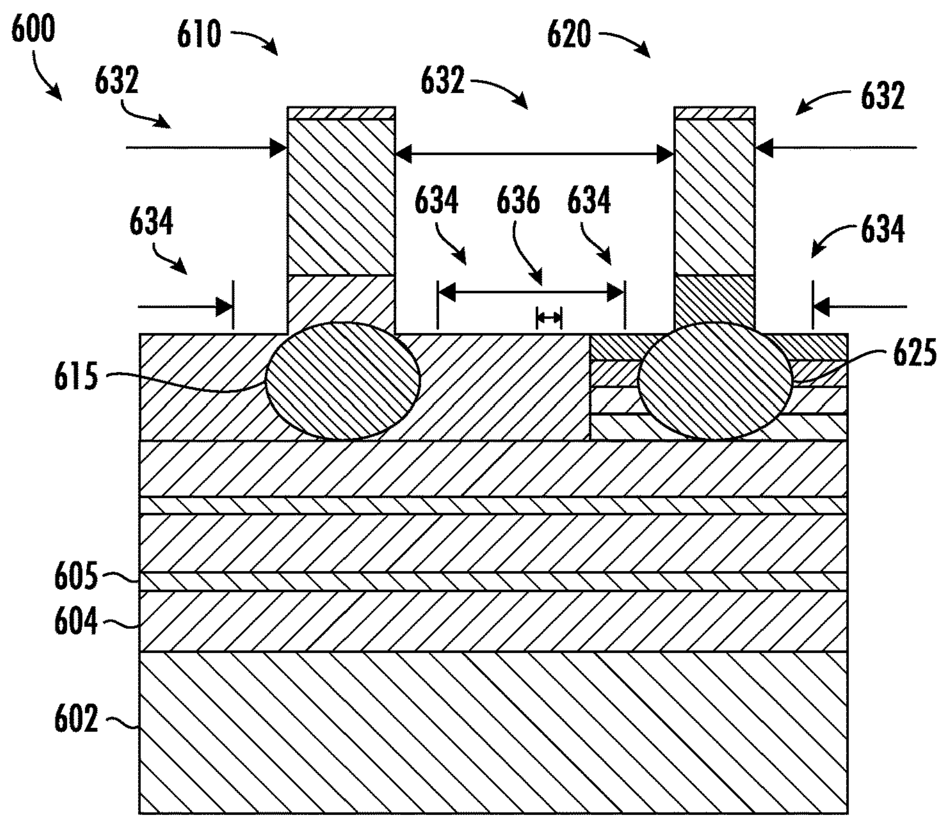
FIG. 6 depicts a cross-sectional view of an example semiconductor die according to some implementations of the present disclosure.

Next, the semiconductor die 500 may be subject to one or more etch processes to produce a final semiconductor die such as the semiconductor die 600 of FIG. 6. For instance, FIG. 6 depicts a cross-sectional view of an example intermediary semiconductor die 600 according to some implementations of the present disclosure. In particular, the semiconductor die 600 may be the semiconductor die 500 after being subject to one or more etch processes. The semiconductor die 600 can be manufactured into a PIC included in a LIDAR system, such as the LIDAR system 200 of FIG. 2.

FIG. 6 depicts a semiconductor die 600 at a subsequent manufacturing stage from the semiconductor die 500 of FIG. 5. The semiconductor die 600 can have a substrate 602, one or more waveguide layers 604 and one or more spacer layers 605, a first semiconductor stack 610 (e.g., a modulator) and a second semiconductor stack 620 (e.g., an amplifier). The semiconductor die 600 can be subject to a first etch process at a first etch region 632 to produce the semiconductor die 600 from the semiconductor die 500 of FIG. 5. For instance, the semiconductor die 500 of FIG. 5 can be subject to an etch process where the regions of the surface of the semiconductor die 500 not included in the first etch region 632 are masked while the first etch region 632 is exposed to the etch process.

The first etch process can produce a semiconductor die 600 having optical modes 615, 625. As illustrated in FIG. 6, the optical modes 615, 625 are primarily concentrated in layers near the top of the die 600, instead of near the waveguide layers 404 as in the semiconductor die 400 of FIG. 4.

The semiconductor die 600 can then be subject to a second etch process at second etch region 634 to isolate the first semiconductor stack 610 from the second semiconductor stack 620. Additionally or alternatively, the semiconductor die 600 can be subject to a third etch process at third etch region 636 to produce a deep etch ridge in the waveguide layers 604. For instance, the semiconductor stacks 610, 620 can be isolated such that optical modes 615, 625 are moved towards the waveguide layers 404 as in the semiconductor die 400 of FIG. 4.

Figure 7:
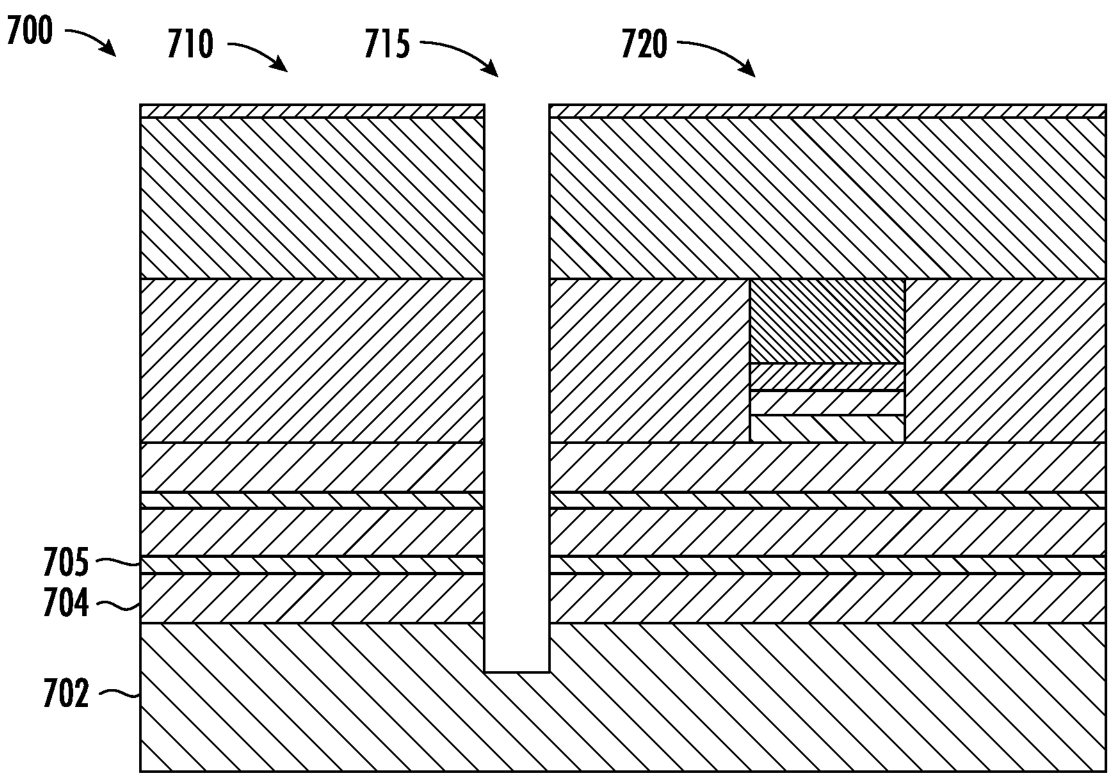
FIG. 7 depicts a cross-sectional view of an example intermediary semiconductor die according to some implementations of the present disclosure.

FIG. 7 depicts a semiconductor die 700 at a subsequent manufacturing stage from the semiconductor die 500 of FIG. 5. The semiconductor die 700 can have a substrate 702, one or more waveguide layers 704 and one or more spacer layers 705, a first semiconductor stack 710 (e.g., a modulator) and a second semiconductor stack 720 (e.g., an amplifier). For instance, the semiconductor die 500 of FIG. 5 can be subject to an etch process to form semiconductor die 700 having a deep ridge etch 715, which separates the semiconductor die 700 into a first semiconductor stack 710 and a second semiconductor stack 720. In some implementations, as in FIG. 7, the deep ridge etch 715 can be formed prior to etching the layers of each semiconductor stack 710, 720. Alternatively, as in FIG. 6, the layers can be etched prior to forming a deep ridge etch.

Figure 8:
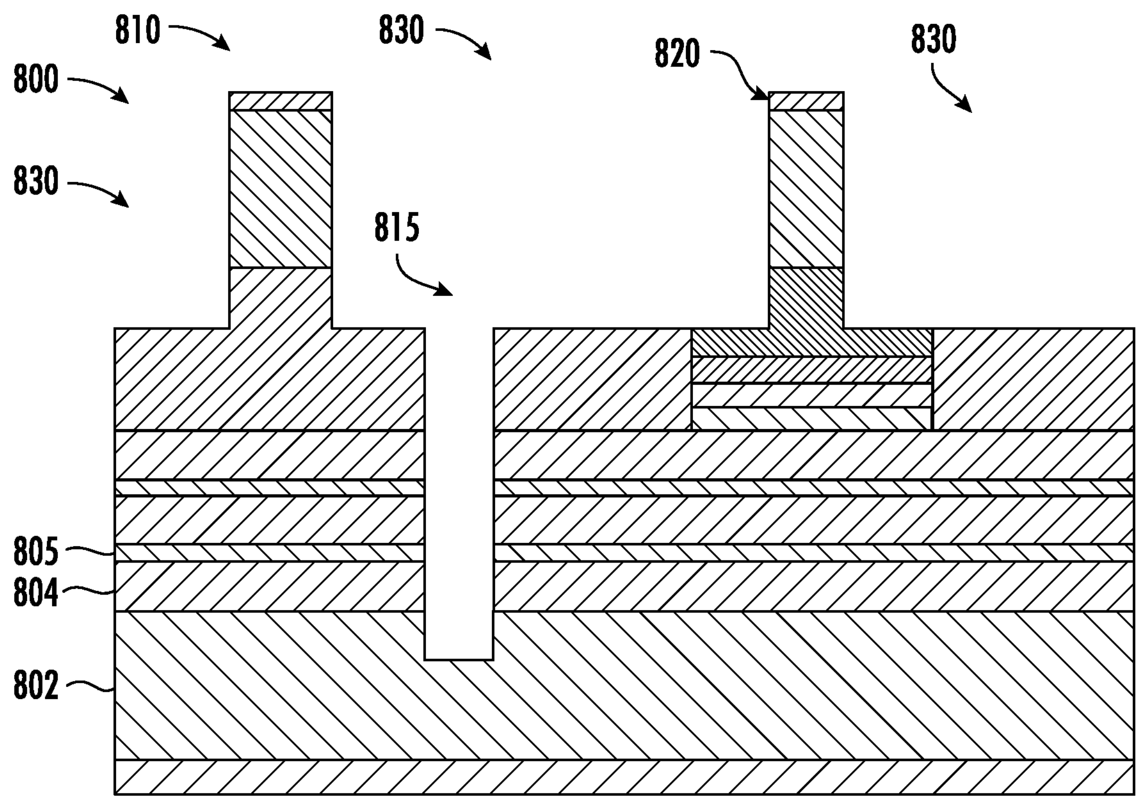
FIG. 8 depicts a cross-sectional view of an example intermediary semiconductor die according to some implementations of the present disclosure.

FIG. 8 depicts a semiconductor die 800 at a subsequent manufacturing stage from the semiconductor die 700 of FIG. 7. The semiconductor die 800 can have a substrate 802, one or more waveguide layers 804 and one or more spacer layers 805, and a first semiconductor stack 810 (e.g., a modulator) and a second semiconductor stack 820 (e.g., an amplifier) separated by a deep ridge etch 815. For instance, the semiconductor die 700 of FIG. 7 can be subject to a first etch process to produce semiconductor die 800 having first etch regions 830. The first etch regions 830 can push the optical mode of the stacks 810, 820 towards the substrate 802 and into the waveguide layers 804. To form the semiconductor die 400 of FIG. 4, the semiconductor die 800 can be subject to one or more second etch process(es).

Figure 9:
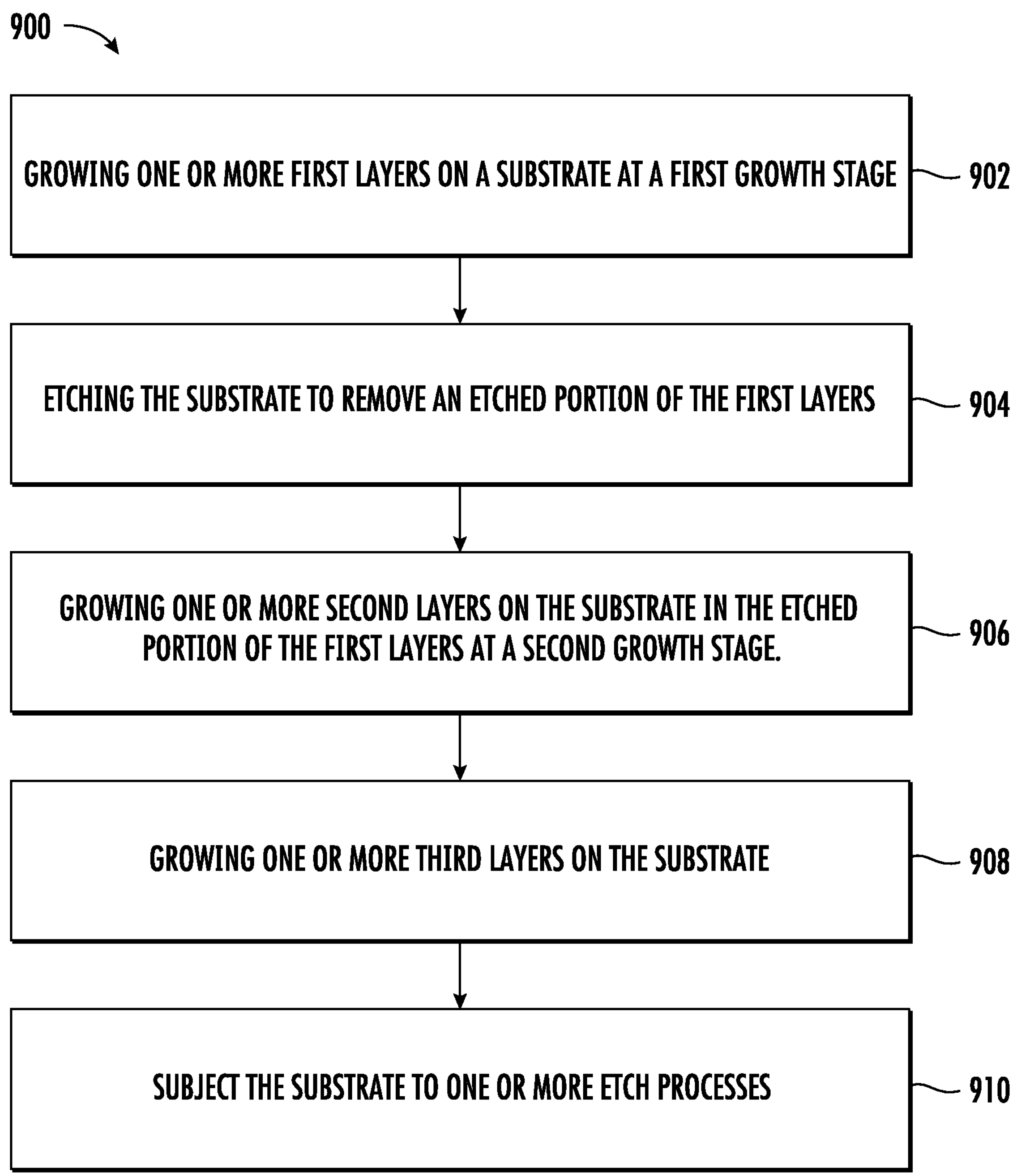
FIG. 9 depicts a flowchart diagram of an example method for producing a photonics integrated circuit according to some implementations of the present disclosure.

FIG. 9 depicts a flowchart diagram of an example method 900 for forming a photonics integrated circuit according to some implementations of the present disclosure. FIG. 9 depicts elements performed in a particular order for purposes of illustration and discussion. Those of ordinary skill in the art, using the disclosures provided herein, will understand that the elements of any of the methods discussed herein can be adapted, rearranged, expanded, omitted, combined, or modified in various ways without deviating from the scope of the present disclosure.

At 902, the method 900 can include growing one or more first layers on a substrate at a first growth stage. The substrate may be, for example, a metal substrate, a semiconductor die, and/or other suitable substrate. The first layers can be grown by any suitable growth or regrowth process, such as, for example, metal-organic chemical vapor deposition (MOVCD). The first layers can include one or more waveguide layers, one or more spacer layers, an n-doped group III-V semiconductor (e.g., InP) layer, a multiple quantum wells (MQW) layer, and a p-doped group III-V semiconductor (e.g., InP) layer. In some implementations, the one or more waveguide layers can be formed of a group III-V semiconductor material. For instance, the group III-V semiconductor material can be or can include one or more of indium phosphide (InP), gallium arsenide (GaAs), indium arsenide (InAs), gallium nitride (GaN), or indium antimonide (InSb).

The one or more first layers can be associated with a first semiconductor stack. For instance, the first layers can correspond to the layers of a first semiconductor stack (or first plurality of semiconductor stacks) to be formed on the substrate. For instance, the one or more first layers may be at least a portion of a semiconductor stack that will eventually form a first semiconductor device (e.g., an amplifier, a phase modulator, etc.). Although at least some of the first layers may be associated with a first semiconductor stack (e.g., and/or not associated with other semiconductor stacks on the substrate), the first layers may be grown in a greater region on the substrate than that corresponding to the first semiconductor stack. For instance, in some implementations, the first layers may be grown across an entire surface of the substrate.

At 904, the method 900 can include etching the substrate to remove an etched portion of the first layers. The etched portion may not be associated with a first semiconductor stack. For instance, a mask can be formed on the portions of the first layers that are associated with the first semiconductor stack such that the portions of the first layers associated with the first semiconductor stack remain after the etch process is complete. Some first layers that are common to each semiconductor stack (e.g., the waveguide layers and/or spacer layers) may not be etched.

At 906, the method 900 can include growing one or more second layers on the substrate in the etched portion of the first layers at a second growth stage. The one or more second layers can form a second semiconductor stack. During the second growth stage, the one or more second layers can be grown in the etched portions of the first layers. For instance, in some implementations, the n-doped group III-V semiconductor (e.g., InP) layer, multiple quantum wells (MQW) layer, and/or p-doped group III-V semiconductor (e.g., InP) layer are etched away at a depth T and replaced with second layer(s) in the second growth stage. The one or more second layers can include, for instance, an n-doped semiconductor layer. In some implementations, after the second growth stage, a second etch process may be performed on areas of the first semiconductor stack such that the second layer(s) are not present in the first semiconductor stack after the second etch process.

In some implementations, at 908, the method 900 can further include growing one or more third layers on the substrate. The one or more third layers can be associated with both the first semiconductor stack and the second semiconductor stack. For instance, the one or more third layers can be grown on the portion of the first layers that are not etched in the etched portion and/or the second layers formed in the etched portion. The one or more third layers can include a p-doped group III-V semiconductor layer, an insulating layer, and/or other suitable layers.

In some implementations, at 910, the method 900 can include subjecting the substrate to one or more etch processes. For instance, in some implementations, the method 900 can include etching a deep ridge etch in the substrate to isolate the first semiconductor stack from the second semiconductor stack. For instance, the deep ridge etch can be etched to isolate an optical mode of the first semiconductor stack from an optical mode of the second semiconductor stack. In some implementations, the method can include etching away a first etch region of the substrate in a first etch process. The first etch region can include at least a portion of the one or more third layers, the n-doped semiconductor layer, and the p-doped group III-V semiconductor layer. For instance, the first etch region can be a largest region. The first etch process can etch away a top portion of the layers formed on the substrate, such as the third layers. Additionally, in some implementations, the method can include etching away a second etch region of the substrate in a second etch process. The second etch region can include at least a portion of the n-doped semiconductor layer, the p-doped group III-V semiconductor layer, the multiple quantum wells layer, and the n-doped group III-V semiconductor layer. For instance, the second etch region can etch away some of the first and/or second layers. Additionally, in some implementations, the method can include etching away a third etch region of the substrate in a third etch process to form a deep ridge etch in the substrate. The third etch region can include at least a portion of the one or more waveguide layers and the one or more spacer layers.

For instance, one particular implementation of a method for forming a photonics integrated circuit according to example aspects of the present disclosure can include growing one or more first layers on a substrate at a first growth stage, the one or more first layers associated with a first semiconductor stack, the one or more first layers including one or more waveguide layers, one or more spacer layers, an n-doped group III-V semiconductor layer, a multiple quantum wells layer, and a p-doped group III-V semiconductor layer. The method can additionally include etching the substrate to remove an etched portion of the first layers not associated with the first semiconductor stack, the etched portion of the first layers not associated with the first semiconductor stack including an etched portion of the n-doped group III-V semiconductor layer, the multiple quantum wells layer, and the p-doped group III-V semiconductor layer. The method can additionally include growing one or more second layers on the substrate in the etched portion of the first layers at a second growth stage to form a second semiconductor stack, the one or more second layers including at least an n-doped semiconductor layer. The method can additionally include growing one or more third layers on the substrate, the one or more third layers associated with both the first semiconductor stack and the second semiconductor stack, the one or more third layers including a p-doped group III-V semiconductor layer and an insulating layer.

Additionally, in some implementations, the method can include etching away a first etch region of the substrate in a first etch process, the first etch region including at least a portion of the one or more third layers, the n-doped semiconductor layer, and the p-doped group III-V semiconductor layer, etching away a second etch region of the substrate in a second etch process, the second etch region including at least a portion of the n-doped semiconductor layer, the p-doped group III-V semiconductor layer, the multiple quantum wells layer, and the n-doped group III-V semiconductor layer; and/or etching away a third etch region of the substrate in a third etch process to form a deep ridge etch in the substrate, the third etch region including at least a portion of the one or more waveguide layers and the one or more spacer layers.

Computing tasks discussed herein as being performed at computing device(s) remote from the autonomous platform (e.g., autonomous vehicle) can instead be performed at the autonomous platform (e.g., via a vehicle computing system of the autonomous vehicle), or vice versa. Such configurations can be implemented without deviating from the scope of the present disclosure. The use of computer-based systems allows for a great variety of possible configurations, combinations, and divisions of tasks and functionality between and among components. Computer-implemented operations can be performed on a single component or across multiple components. Computer-implemented tasks or operations can be performed sequentially or in parallel. Data and instructions can be stored in a single memory device or across multiple memory devices.

Aspects of the disclosure have been described in terms of illustrative implementations thereof. Numerous other implementations, modifications, or variations within the scope and spirit of the appended claims can occur to persons of ordinary skill in the art from a review of this disclosure. Any and all features in the following claims can be combined or rearranged in any way possible. Accordingly, the scope of the present disclosure is by way of example rather than by way of limitation, and the subject disclosure does not preclude inclusion of such modifications, variations or additions to the present subject matter as would be readily apparent to one of ordinary skill in the art. Moreover, terms are described herein using lists of example elements joined by conjunctions such as "and," "or," "but," etc. It should be understood that such conjunctions are provided for explanatory purposes only. Lists joined by a particular conjunction such as "or," for example, can refer to "at least one of" or "any combination of" example elements listed therein, with "or" being understood as "and/or" unless otherwise indicated. Also, terms such as "based on" should be understood as "based at least in part on."

Those of ordinary skill in the art, using the disclosures provided herein, will understand that the elements of any of the claims, operations, or processes discussed herein can be adapted, rearranged, expanded, omitted, combined, or modified in various ways without deviating from the scope of the present disclosure. Some of the claims are described with a letter reference to a claim element for exemplary illustrated purposes and is not meant to be limiting. The letter references do not imply a particular order of operations. For instance, letter identifiers such as (a), (b), (c), . . . , (i), (ii), (iii), . . . , etc. can be used to illustrate operations. Such identifiers are provided for the ease of the reader and do not denote a particular order of steps or operations. An operation illustrated by a list identifier of (a), (i), etc. can be performed before, after, or in parallel with another operation illustrated by a list identifier of (b), (ii), etc.

The following describes the technology of this disclosure within the context of a LIDAR system and an autonomous vehicle for example purposes only. As described herein, the technology described herein is not limited to an autonomous vehicle and can be implemented for or within other systems, autonomous platforms, and other computing systems.

What is claimed is:

1. A light detection and ranging (LIDAR) sensor system for a vehicle, the LIDAR sensor system comprising:

a light source configured to output a beam;

a photonics integrated circuit (PIC) comprising a semiconductor die, the semiconductor die comprising a substrate having two or more semiconductor stacks respectively associated with two or more different semiconductor devices formed on the substrate, the two or more different semiconductor devices respectively configured to receive the beam from the light source and modify one or more features of the beam, wherein a first semiconductor device of the two or more different semiconductor devices comprises a first plurality of layers including the substrate, wherein a second semiconductor device of the two or more different semiconductor devices comprises a second plurality of layers including the substrate, wherein a second arrangement of the second plurality of layers differs from a first arrangement of the first plurality of layers, and wherein the first arrangement of the first plurality of layers and the second arrangement of the second plurality of layers are formed by parallel regrowth on the substrate;

a transmitter configured to receive the beam from the semiconductor die; and one or more optics configured to receive the beam from the transmitter and emit the beam towards an object.

2. The LIDAR system of claim 1, wherein one or more of the first plurality of layers comprise an n-doped group III-V semiconductor layer, a multiple quantum wells (MQW) layer, and a p-doped group III-V semiconductor layer.

3. The LIDAR system of claim 1, wherein one or more of the second plurality of layers comprise an n-doped semiconductor layer.

4. The LIDAR system of claim 1, further comprising one or more third layers comprising one or more waveguide layers configured to propagate optical signals.

5. The LIDAR system of claim 4, wherein the one or more waveguide layers comprise group III-V semiconductor material providing improved transmission characteristics for the optical signals.

6. The LIDAR system of claim 4, wherein the one or more third layers comprise one or more spacer layers configured to isolate the one or more waveguide layers.

7. The LIDAR system of claim 4, wherein the one or more third layers comprise one or more insulating layers configured to insulate the two or more semiconductor stacks from outside electrical contact.

8. The LIDAR system of claim 1, wherein the two or more semiconductor stacks respectively define an optical mode.

9. The LIDAR system of claim 1, wherein the two or more semiconductor stacks are directly formed on the substrate.

10. The LIDAR system of claim 1, wherein the two or more different semiconductor devices comprise at least one of: a modulator configured to modify a phase or a frequency of the beam; or an amplifier configured to modify an amplitude of the beam.

11. An autonomous vehicle (AV) control system, comprising:

one or more processors; and a photonics integrated circuit (PIC) comprising a semiconductor die, the semiconductor die comprising a substrate having two or more semiconductor stacks respectively associated with two or more different semiconductor devices directly formed on the substrate, the two or more different semiconductor devices respectively configured to receive a beam from a light source and modify the beam, wherein a first semiconductor device of the two or more different semiconductor devices comprises a first plurality of layers including the substrate, wherein a second semiconductor device of the two or more different semiconductor devices comprises a second plurality of layers including the substrate, wherein a second arrangement of the second plurality of layers differs from a first arrangement of the first plurality of layers, and wherein the first arrangement of the first plurality of layers and the second arrangement of the second plurality of layers are formed by parallel regrowth on the substrate.

12. The AV control system of claim 11, wherein one or more of the first plurality of layers comprise an n-doped group III-V semiconductor layer, a multiple quantum wells (MQW) layer, and a p-doped group III-V semiconductor layer; and wherein one or more of the second plurality of layers comprise an n-doped semiconductor layer.

13. The AV control system of claim 11, further comprising one or more third layers comprise one or more waveguide layers, the one or more waveguide layers configured to propagate optical signals.

14. The AV control system of claim 13, wherein the one or more third layers comprise one or more spacer layers disposed between the one or more waveguide layers, the one or more spacer layers configured to isolate the one or more waveguide layers.

15. An autonomous vehicle, comprising:

an autonomous vehicle control system, the autonomous vehicle control system comprising one or more processors; and a light detection and ranging (LIDAR) system, the LIDAR system comprising:

a light source configured to output a beam;

a photonics integrated circuit (PIC) comprising a semiconductor die, the semiconductor die comprising a substrate having two or more semiconductor stacks respectively associated with two or more different semiconductor devices directly formed on the substrate, the two or more different semiconductor devices respectively configured to receive the beam from the light source and modify the beam, wherein a first semiconductor device of the two or more different semiconductor devices comprises a first plurality of layers including the substrate, wherein a second semiconductor device of the two or more different semiconductor devices comprises a second plurality of layers including the substrate, wherein a second arrangement of the second plurality of layers differs from a first arrangement of the first plurality of layers, and wherein the first arrangement of the first plurality of layers and the second arrangement of the second plurality of layers are formed by parallel regrowth on the substrate;

a transmitter configured to receive the beam from the semiconductor die; and one or more optics configured to receive the beam from the transmitter and emit the beam towards an object.

* * * * *